United States Patent
Nagai et al.

(10) Patent No.: US 7,364,986 B2
(45) Date of Patent: Apr. 29, 2008

(54) LASER BEAM PROCESSING METHOD AND LASER BEAM MACHINE

(75) Inventors: Yusuke Nagai, Tokyo (JP); Satoshi Kobayashi, Tokyo (JP)

(73) Assignee: Disco Corporation, Tokyo (JP)

( * ) Notice: Subject to any disclaimer, the term of this patent is extended or adjusted under 35 U.S.C. 154(b) by 487 days.

(21) Appl. No.: 10/945,103

(22) Filed: Sep. 21, 2004

(65) Prior Publication Data
US 2005/0070075 A1 Mar. 31, 2005

(30) Foreign Application Priority Data
Sep. 26, 2003 (JP) ............... 2003-334951

(51) Int. Cl.
*H01L 21/301* (2006.01)
*H01L 21/46* (2006.01)
*H01L 21/78* (2006.01)
*B23K 26/16* (2006.01)

(52) U.S. Cl. .............. 438/463; 438/462; 438/795; 257/E21.596; 269/121.67

(58) Field of Classification Search ........... 438/797, 438/795, 463, 7
See application file for complete search history.

(56) References Cited

U.S. PATENT DOCUMENTS 6,399,463 B1 * 6/2002 Glenn et al. ............ 438/463
6,498,075 B1 * 12/2002 Fujimoto et al. ......... 438/462
6,992,026 B2 * 1/2006 Fukuyo et al. .......... 438/797
2005/0003633 A1 * 1/2005 Mahle et al. ........... 438/463

FOREIGN PATENT DOCUMENTS

JP 2002-192367 7/2002
JP 2003-124155 4/2003

\* cited by examiner

*Primary Examiner*—Scott B. Geyer
*Assistant Examiner*—Seahvosh Nikmanesh
(74) *Attorney, Agent, or Firm*—Smith, Gambrell & Russell, LLP

(57) ABSTRACT

A laser beam processing method comprising the step of processing-feeding a wafer having devices which are formed in a large number of areas sectioned by streets arranged in a lattice pattern on the front surface while a laser beam capable of passing through the wafer is applied to the wafer to form deteriorated layers along the streets in the inside of the wafer, wherein the laser beam is applied at a predetermined angle toward a direction intersecting at right angles to the processing-feed direction relative to a direction perpendicular to the laser beam applied surface of the wafer.

5 Claims, 5 Drawing Sheets

LASER BEAM PROCESSING METHOD AND LASER BEAM MACHINE

CROSS-REFERENCE TO RELATED APPLICATION

The present application contains subject matter related to the Japanese patent application JP 2003-334951, filed in the Japanese Patent Office on Sep. 26, 2003, the entire contents of which being incorporated herein by reference.

FIELD OF THE INVENTION

The present invention relates to a laser beam processing method and a laser beam machine for applying a laser capable of passing through a wafer having devices which are formed in a plurality of areas sectioned by dividing lines called "streets" formed in a lattice pattern on the front surface thereof, to the wafer along the streets, to form deteriorated layers in the inside of the wafer.

DESCRIPTION OF THE PRIOR ART

In the production process of a semiconductor device, a plurality of areas are sectioned by streets arranged in a lattice pattern on the front surface of a substantially disk-like semiconductor wafer and a circuit (device) such as IC, LSI or the like is formed in each of the sectioned areas. Individual semiconductor chips are manufactured by cutting this semiconductor wafer along the streets to divide it into the areas having the circuit formed therein. An optical device wafer comprising gallium nitride-based compound semiconductors laminated on the front surface of a sapphire substrate is also cut along streets to be divided into individual optical devices such as light emitting diodes or laser diodes that are widely used in electric equipment.

Chips such as semiconductor chips and optical devices have generally a shape of rectangular parallelepiped. However, to improve the characteristic properties of the chips and to conform the front surfaces and back surfaces of the chips, they may be formed parallelogram or trapezoid in a certain case.

Cutting along the streets of the semiconductor wafer or optical device wafer is generally carried out by a cutting machine called "dicer". This cutting machine comprises a chuck table for holding a workpiece such as a semiconductor wafer or optical device wafer, a cutting means for cutting the workpiece held on the chuck table, and a moving means for moving the chuck table and the cutting means relative to each other. The cutting means has a spindle unit that comprises a rotary spindle, a cutting blade mounted to the spindle and a drive mechanism for rotary-driving the rotary spindle. The cutting blade comprises a disk-like base and an annular cutting edge that is mounted on the side wall outer peripheral portion of the base and formed as thick as about 20 μm by fixing diamond abrasive grains having a diameter of about 3 μm to the base by electroforming.

However, as disclosed by JP-A 2003-124155, to cut the devices formed on the wafer into shapes of parallelogram or trapezoid by the above cutting machine, the above chuck table or spindle unit is inclined during processing.

Meanwhile, as a means of dividing a plate-like workpiece such as a semiconductor wafer, a laser beam processing method for applying a laser beam capable of passing through the workpiece with its focusing point on the inside of the area to be divided is attempted and disclosed by JP-A 2002-192367, for example. In the dividing method using this laser beam processing technique, a workpiece is divided by applying a laser beam having an infrared range, that is capable of passing through the workpiece, from one surface side thereof with its focusing point on the inside thereof, to continuously form deteriorated layers along the streets in the inside of the workpiece, and exerting external force along the streets whose strength has been reduced by the formation of the deteriorated layers.

To cut the workpiece with the cutting machine in such a way that the chuck table or spindle unit is inclined, a large scaled mechanism for inclining the chuck table or spindle unit is necessary.

Further, since a sapphire substrate, silicon carbide substrate, lithium tantalite substrate and the like have a high Mohs hardness, cutting with the above cutting blade is not always easy. Since the cutting blade has a thickness of about 20 μm, the streets for sectioning devices needs to have a width of about 50 μm. Therefore, in the case of a device measuring about 300 μm×300 μm, the area ratio of the streets to the wafer is large, thereby reducing productivity.

SUMMARY OF THE INVENTION

It is an object of the present invention to provide a laser beam processing method and a laser beam machine, which are capable of dividing a wafer into parallelogram or trapezoid chips by using a laser beam processing technique, even when streets formed on the wafer are narrow in width.

To attain the above object, according to the present invention, there is provided a laser beam processing method comprising the step of processing-feeding a wafer having devices which are formed in a large number of areas sectioned by streets arranged in a lattice pattern on the front surface while a laser beam capable of passing through the wafer is applied to the wafer, to form deteriorated layers along the streets in the inside of the wafer, wherein the laser beam is applied at a predetermined angle toward a direction intersecting at right angles to the processing-feed direction relative to a direction perpendicular to the surface, to which the laser beam is applied, of the wafer.

The above laser beam is applied from axisymmetric two directions along a street to form a v-shaped deteriorated layer. Preferably, the above laser beam is applied from the back surface side of the wafer.

According to the present invention, there is provided a laser beam machine comprising a chuck table for holding a workpiece, a laser beam application means comprising a condenser for applying a laser beam to the workpiece held on the workpiece holding means, and a processing-feed means for processing-feeding the condenser and the chuck table relative to each other, wherein the condenser is constituted to be allowed to tilt toward a direction intersecting at right angles to the processing-feed direction relative to a direction perpendicular to the workpiece holding surface of the chuck table.

In the present invention, since the laser beam is applied to the wafer at a predetermined angle toward a direction intersecting at right angles to the processing-feed direction relative to a direction perpendicular to the surface, to which the laser beam is applied, of the wafer to form deteriorated layers in the inside of the wafer, even when the streets formed on the wafer are narrow in width, the wafer can be divided into parallelogram or trapezoid chips. Further, in the laser beam machine of the present invention, as only the condenser of the laser beam application means may be tilted, a mechanism for tilting is simple.

DETAILED DESCRIPTION OF THE PREFERRED EMBODIMENTS

A laser beam processing method and a laser beam machine according to preferred embodiments of the present invention will be described in detail hereinunder with reference to the accompanying drawings.

Figure 1:
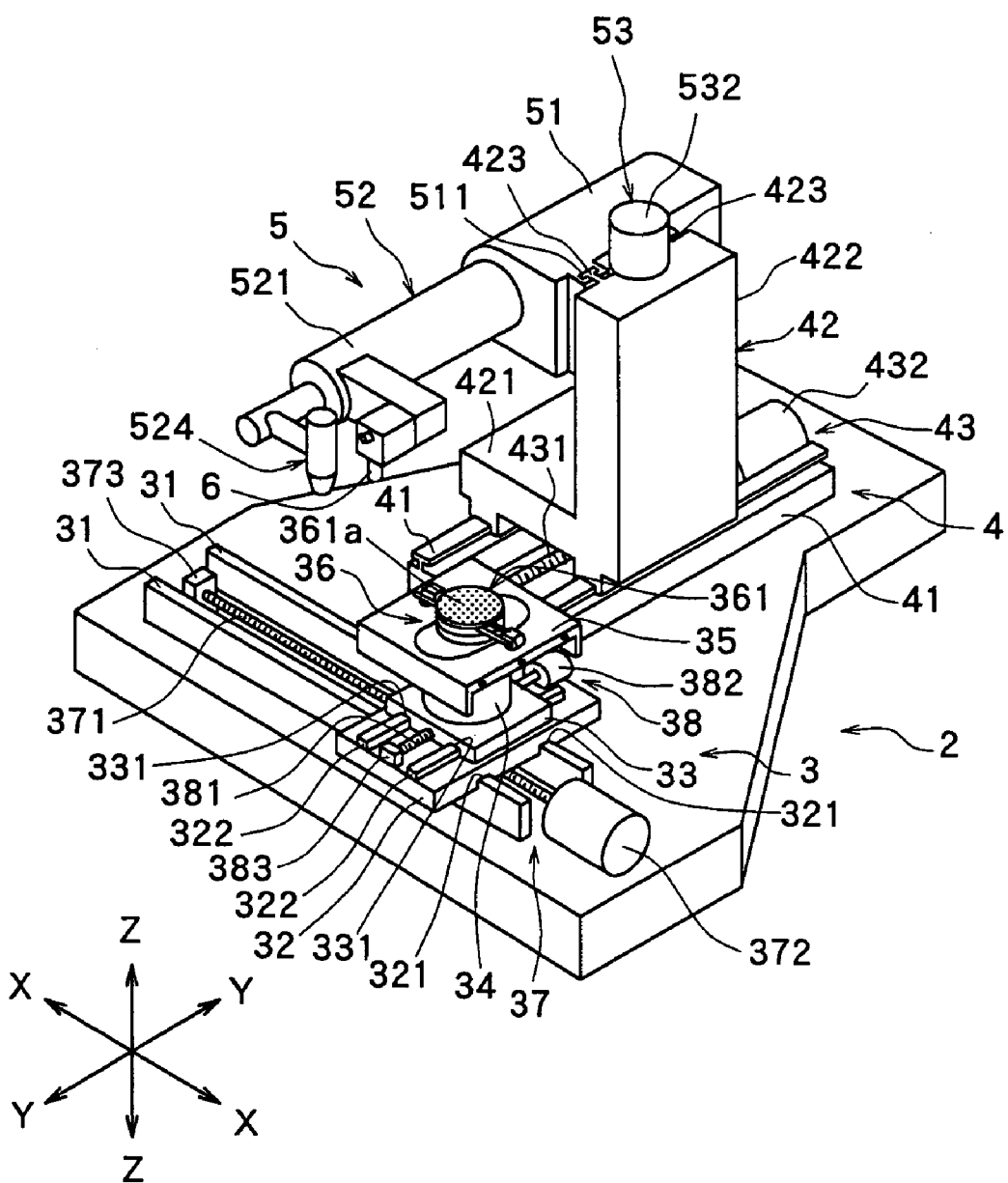
FIG. 1 is a perspective view of a laser beam machine constituted according to the present invention.

FIG. 1 is a perspective view of the laser beam machine constituted according to the present invention. The laser beam machine shown in FIG. 1 comprises a stationary base 2, a chuck table mechanism 3, which is mounted on the stationary base 2 in such a manner that it can move in a processing-feed direction indicated by an arrow X and holds a workpiece, a laser beam application unit support mechanism 4 mounted on the stationary base 2 in such a manner that it can move in an indexing-feed direction indicated by an arrow Y perpendicular to the direction indicated by the arrow X, and a laser beam application unit 5 mounted on the laser beam application unit support mechanism 4 in such a manner that it can move in a direction indicated by an arrow Z.

The above chuck table mechanism 3 comprises a pair of guide rails 31 and 31, which are mounted on the stationary base 2 and arranged parallel to each other in the direction indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the direction indicated by the arrow Y, a support table 35 supported on the second sliding block 33 by a cylindrical member 34, and a chuck table 36 as a workpiece holding means. This chuck table 36 has an adsorption chuck 361 made of a porous material and having a workpiece holding surface 361a so that a disk-like semiconductor wafer as a workpiece is held on the workpiece holding surface 361a by a suction means that is not shown. The chuck table 36 is rotated by a pulse motor (not shown) installed in the cylindrical member 34.

The above first sliding block 32 has, on its undersurface, a pair of to-be-guided grooves 321 and 321 to be fitted to the above pair of guide rails 31 and 31 and, on its top surface, a pair of guide rails 322 and 322 formed parallel to each other in the direction indicated by the arrow Y. The first sliding block 32 constituted as described above can move in the direction indicated by the arrow X along the pair of guide rails 31 and 31 by fitting the to-be-guided grooves 321 and 321 to the pair of guide rails 31 and 31, respectively. The chuck table mechanism 3 in the illustrated embodiment has a processing-feed means 37 for moving the first sliding block 32 along the pair of guide rails 31 and 31 in the processing-feed direction indicated by the arrow X. The processing-feed means 37 has a male screw rod 371 arranged between the above pair of guide rails 31 and 31 in parallel thereto, and a drive source such as a pulse motor 372 for rotary-driving the male screw rod 371. The male screw rod 371 is, at its one end, rotatably supported on a bearing block 373 fixed on the above stationary base 2 and is, at its other end, connected to the output shaft of the above pulse motor 372 by a speed reducer that is not shown. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on its undersurface, a pair of to-be-guided grooves 331 and 331 to be fitted to the pair of guide rails 322 and 322 on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 in the indexing-feed direction indicated by the arrow Y along the pair of guide rails 322 and 322 on the first sliding block 32. The first indexing-feed means 38 has a male screw rod 381 that is arranged between the above pair of guide rails 322 and 322 in parallel thereto, and a drive source such as a pulse motor 382 for rotary-driving the male screw rod 381. The male screw rod 381 is, at its one end, rotatably supported to a bearing block 383 fixed on the top surface of the above first sliding block 32 and is, at its other end, connected to the output shaft of the above pulse motor 382 by a speed reducer that is not shown. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41 mounted on the stationary base 2 and arranged parallel to each other in the indexing direction indicated by the arrow Y and a movable support base 42 mounted on the guide rails 41 and 41 in such a manner that it can move in the indexing-feed direction indicated by the arrow Y. This movable support base 42 comprises a movable support portion 421 movably mounted on the guide rails 41 and 41 and a mounting portion 422 mounted on the movable support portion 421. The mounting portion 422 is, on one of its flanks, provided with a pair of guide rails 423 and 423 extending in parallel to each other in the direction indicated by the arrow Z. The laser beam application unit support mechanism 4 in the illustrated embodiment has a second indexing-feed means 43 for moving the movable support base 42 along the pair of guide rails 41 and 41 in the indexing-feed direction indicated by the arrow Y. This second indexing-feed means 43 has a male screw rod 431 arranged between the above pair of guide rails 41 and 41 in parallel thereto, and a drive source such as a pulse motor 432 for rotary-driving the male screw rod 431. The male screw rod 431 is, at its one end, rotatably supported to a bearing block (not shown) fixed on the above stationary base 2 and is, at its other end, connected to the output shaft of the above pulse motor 432 by a speed reducer that is not shown. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively.

Figure 2:
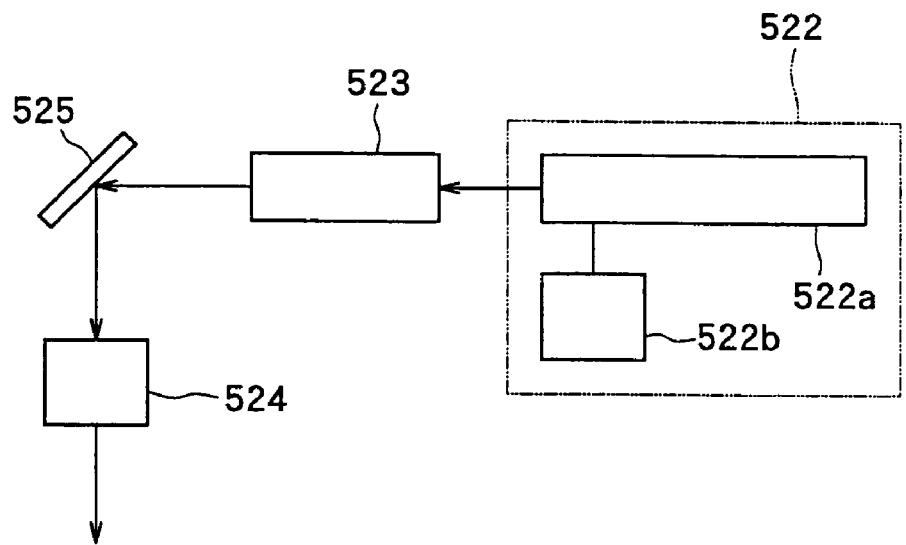
FIG. 2 is a block diagram schematically showing the constitution of a laser beam application means provided in the laser beam machine shown in FIG. 1.

The illustrated laser beam application means 52 comprises a cylindrical casing 521 secured to the above unit holder 51 and extending substantially horizontally. In the casing 521, there are installed a pulse laser beam oscillation means 522 and a transmission optical system 523, as shown in FIG. 2. The pulse laser beam oscillation means 522 is constituted by a pulse laser beam oscillator 522a composed of a YAG laser oscillator or YVO4 laser oscillator and a repetition frequency setting means 522b connected to the pulse laser beam oscillator 522a. The transmission optical system 523 has suitable optical elements such as a beam splitter. A condenser 524 housing condensing lenses (not shown) constituted by a set of lenses that may be a formation known per se is attached to the end of the above casing 521.

Figure 3:
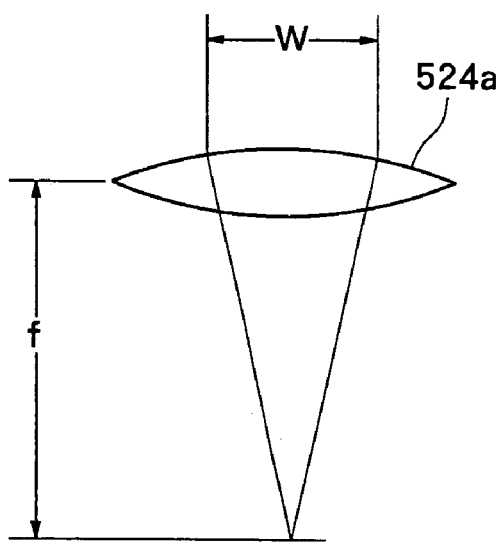
FIG. 3 is a schematic diagram for explaining the focusing spot diameter of a pulse laser beam.

A laser beam oscillated from the above pulse laser beam oscillation means 522 is further deflected by 90° by a deflection mirror 525 through the transmission optical system 523 to reach the condenser 524, and then, the laser beam from the condenser 524 is applied to the workpiece held on the above chuck table 36 at a predetermined focusing spot diameter D. This focusing spot diameter D is defined by the expression D (μm)=4×λ×f/(π×W) (wherein λ is the wavelength of the pulse laser beam, W is the diameter (mm) of a pulse laser beam applied to the objective lens 524a, and f is the focusing distance (mm) of the objective lens 524a) when the pulse laser beam having a Gauss distribution is applied through the objective lens 524a of the condenser 524, as shown in FIG. 3.

Figure 4:
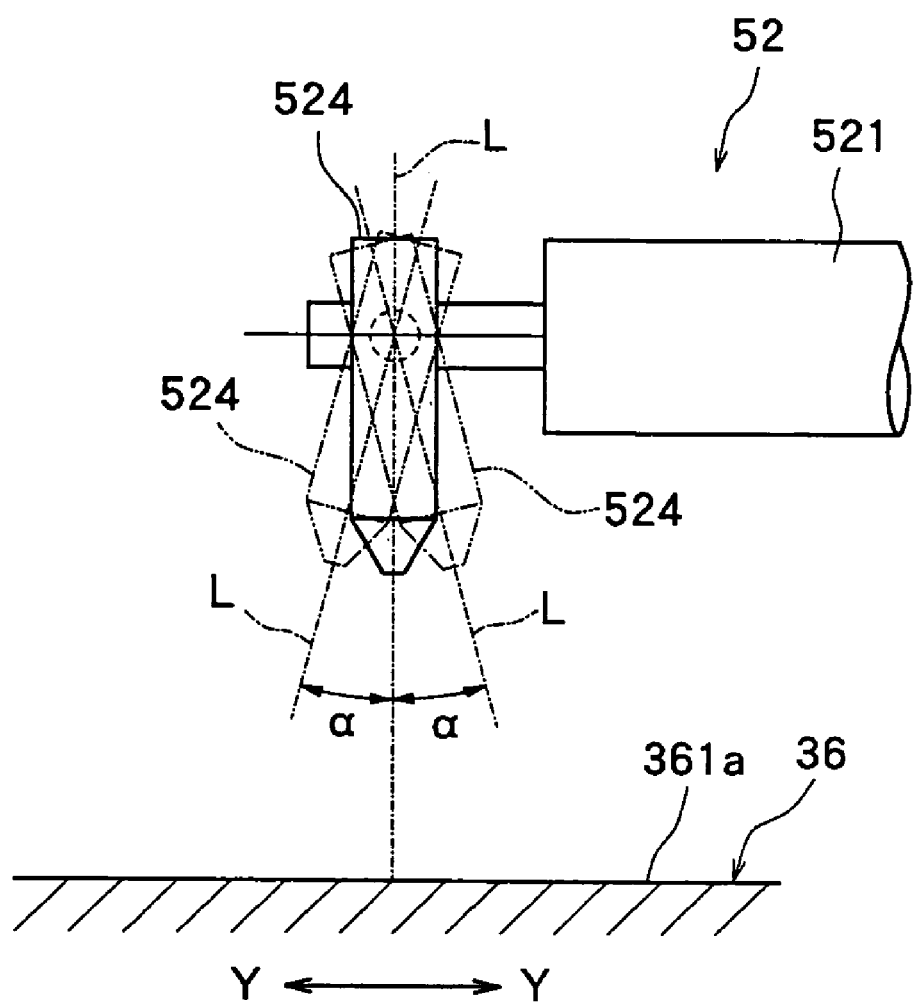
FIG. 4 is an explanatory diagram showing a state where the condenser of the laser beam application means provided in the laser beam machine shown in FIG. 1 is inclined.

The above condenser 524 is constituted to be allowed to tilt toward a direction (indexing-feed direction Y) intersecting at right angles to the processing-feed direction (direction perpendicular to the sheet in FIG. 4) relative to a direction perpendicular to the workpiece holding surface 361a of the chuck table 36 as shown by two-dotted chain lines in FIG. 4. Therefore, the laser beam is applied from the condenser 524 brought to a position shown by one of two-dotted chain lines such that its optical axis L has a predetermined tilt angle α toward the direction (indexing-feed direction Y) intersecting at right angles to the processing-feed direction relative to the direction perpendicular to the workpiece holding surface 361a.

Returning to FIG. 1, an image pick-up means 6 is situated at the front end of the casing 521 constituting the above laser beam application means 52. This image pick-up means 6 in the illustrated embodiment is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for taking an image with visible radiation. An image signal is transmitted to a control means that is not shown.

The laser beam application unit 5 in the illustrated embodiment comprises a moving means 53 for moving the unit holder 51 along the pair of guide rails 423 and 423 in the direction indicated by the arrow Z. The moving means 53 has a male screw rod (not shown) arranged between the pair of guide rails 423 and 423 and a drive source such as a pulse motor 532 for rotary-driving the male screw rod, like the moving means earlier mentioned. By driving the male screw rod (not shown) in a normal direction or reverse direction with the pulse motor 532, the unit holder 51 and the laser beam application means 52 are moved along the guide rails 423 and 423 in the direction indicated by the arrow Z.

The laser beam machine in the illustrated embodiment is constituted as described above, and its operation of processing the semiconductor wafer 10 shown in FIG. 5 will be described hereinbelow.

Figure 5:
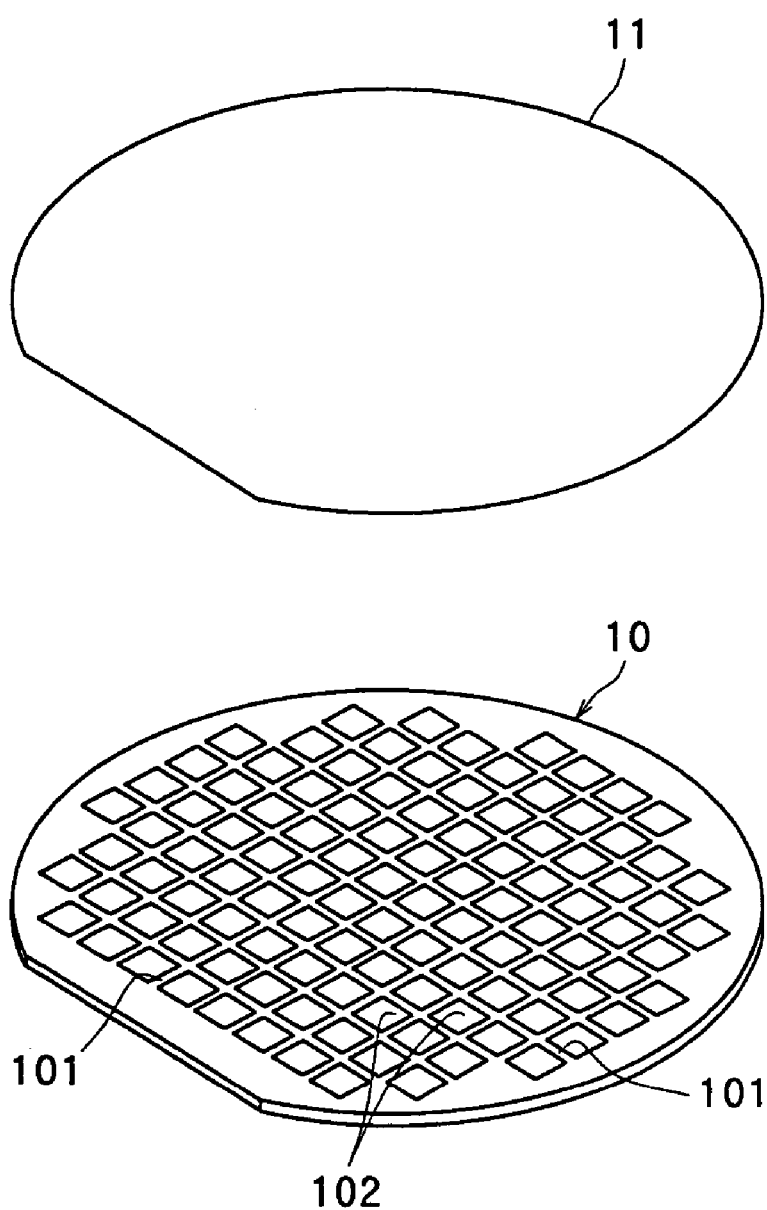
FIG. 5 is a perspective view of a semiconductor wafer as a workpiece.

In the semiconductor wafer 10 shown in FIG. 5, a plurality of areas are sectioned by a plurality of streets 101 formed in a lattice pattern on the front surface, and a circuit 102 (device) such as IC, LSI or the like is formed in each of the sectioned areas. The semiconductor wafer 10 thus constituted has a protective tape 11 affixed to its front surface and is suction-held on the chuck table 36 in such a manner that the back surface faces up. The chuck table 36 suction-holding the semiconductor wafer 10 is moved along the guide rails 31 and 31 by the operation of the processing-feed means 37 and positioned right below the image pick-up means 6 mounted on the laser beam application unit 5.

After the chuck table 36 is positioned right below the image pick-up means 6, image processing such as pattern matching is carried out to align a street 101 that is formed on the semiconductor wafer 10 held on the chuck table 36 with the condenser 524 of the laser beam application means 52 for applying a laser beam along the street 101 by the image pick-up means 6 and a control means (not shown), thereby performing the alignment of a laser beam application position. This alignment is carried out on the condenser 524 that is tilted at a predetermined angle toward one direction shown by one of the two-dot chain lines in FIG. 4. Although the surface, on which the street 101 is formed, of the semiconductor wafer 10 faces down at the time of the above alignment work, the street 101 can be imaged from the back surface as the image pick-up means 6 is constituted by an infrared illuminating means, an optical system for capturing infrared radiation and an image pick-up device (infrared CCD) for outputting an electric signal corresponding to the infrared radiation as described above.

Figure 6:
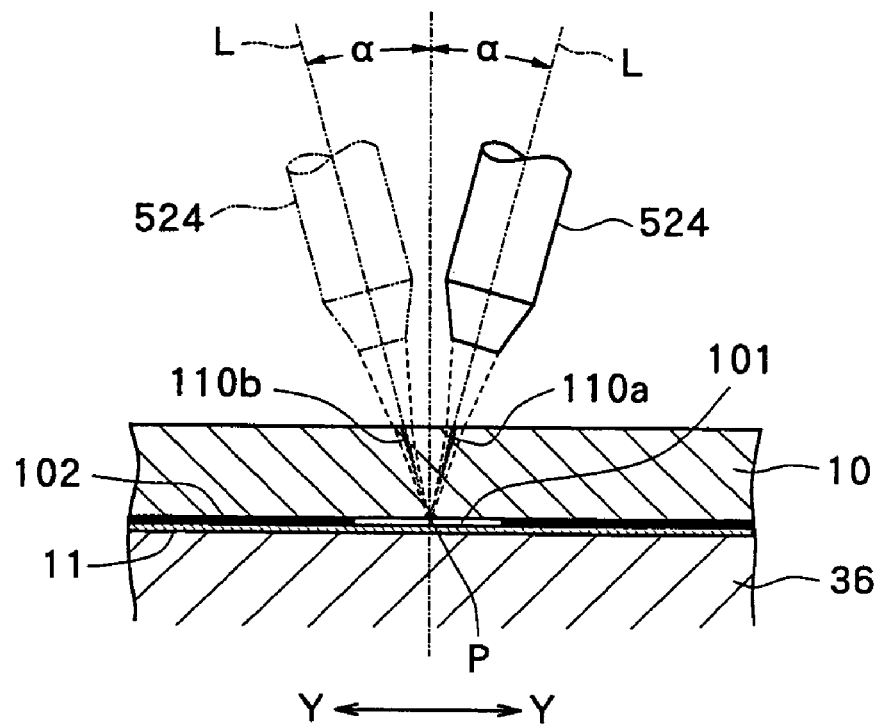
FIG. 6 is a diagram for explaining the laser beam processing method of the present invention.

After the street 101 formed on the semiconductor wafer 10 held on the chuck table 36 is detected and the alignment of the laser beam application position is carried out as described above, the chuck table 36 is moved to a laser beam application range where the condenser 524 of the laser beam application unit 5 for applying a laser beam is located, and a laser beam is applied along the street 101 of the semiconductor wafer 10 from the condenser 524 of the laser beam application means 52 as shown in FIG. 6. That is, the optical axis L of the laser beam applied from the condenser 524 tilted toward one side, as shown by the solid lines in FIG. 6 has a predetermined tilt angle α (for example, 10°) toward a direction (direction indicated by the arrow Y) intersecting at right angles to a processing-feed direction relative to a direction perpendicular to the back surface (top surface, i.e., surface to which the laser beam is applied) of the semiconductor wafer 10. At this point, the laser beam is applied with its focusing point P on the inside of the semiconductor wafer 10, that is, near the front surface (undersurface) so as to form a first continuous deteriorated layer 110a that is tilted toward one side and is formed along the street 101 in the inside of the semiconductor wafer 10. When the semiconductor wafer 10 is thick, the laser beam is applied several times by changing the focusing point P stepwise in the laser beam application direction to form a plurality of deteriorated layers. As a result, the deteriorated layer 110a formed in the inside of the semiconductor wafer 10 is exposed to the front surface and the back surface. Since this deteriorated layer is molten and re-solidified and has greatly reduced strength, it can be extremely easily broken by exerting external force.

The above laser beam processing conditions will be described hereinbelow.

The chuck table 36 is caused to be moved in the direction indicated by the arrow X (see FIG. 1) at a predetermined feed rate (for example, 100 mm/sec) while a pulse laser beam from the condenser 524 of the laser beam application means 52 is applied toward a predetermined street 101, from the back surface of the semiconductor wafer 10. The following infrared laser beam is used as the laser beam.

Light source: Nd:YVO4 pulse laser
Wavelength: 1,064 nm
Pulse energy: 10 μJ
Repetition frequency: 100 kHz
Pulse width: 25 ns
Focusing spot diameter: 1 μm
Energy density of focusing point: $5.1 \times 10E10 W/cm^2$ The first deteriorated layers 110a are thus formed along all the streets 101 formed on the semiconductor wafer 10 as described above.

Thereafter, the condenser 524 of the laser beam application means 52 is brought to the other position opposite to the position shown by the above solid lines, that is, axisymmetric to the position shown by the solid lines so that the optical axis L of the laser beam has a predetermined tilt angle α (for example, 10°) toward the direction (direction indicated by the arrow Y) intersecting at right angles to the processing-feed direction relative to the direction perpendicular to the back surface (top surface, that is, surface to which the laser beam is applied) of the semiconductor wafer 10, as shown by two-dot chain lines in FIG. 6. Then, the above laser beam processing work is carried out by aligning the focusing point P of the laser beam applied from the condenser 524 with the same position as when the above first deteriorated layer 110a is formed, whereby a second continuous deteriorated layer 10b which is inclined toward the other side is formed along the street 101 in the inside of the semiconductor wafer 10. Thus, by forming the second deteriorated layers 110b along all the streets 101, V-shaped deteriorated layers, each consisting of the first deteriorated layer 110a and the second deteriorated layer 10b, are formed along the streets 101 of the semiconductor wafer 10.

Figure 7:
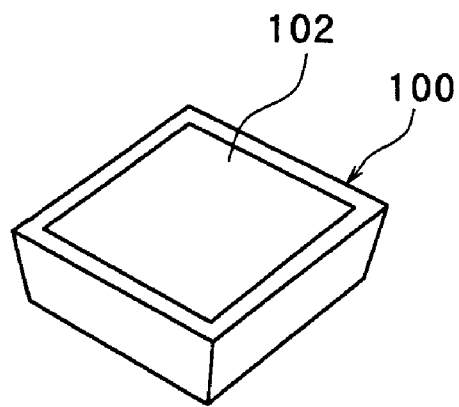
FIG. 7 is a perspective view of a chip divided according to the laser beam processing method of the present invention.

After the first deteriorated layers 110a and the second deteriorated layers 110b are formed along all the streets formed on the semiconductor wafer 10, external force is exerted along the streets whose strength has been reduced by the formation of the deteriorated layers to divide the semiconductor wafer 10 into trapezoid chips 100 as shown in FIG. 7. In the illustrated embodiment, by forming the first deteriorated layers 110a and the second deteriorated layers 110b along the streets 101 formed on the semiconductor wafer as described above, the semiconductor wafer 10 is divided into trapezoid chips 100. To divide the semiconductor wafer 10 into parallelogram chips, however, only either the first deteriorated layers 110a or the second deteriorated layers 10b may be formed.

According to the laser beam processing method of the present invention, as a laser beam is inclined at a predetermined angle toward the direction intersecting at right angles to the processing-feed direction relative to the direction perpendicular to the surface, to which the laser beam is applied, of the wafer to form deteriorated layers in the inside of the wafer, the semiconductor wafer can be divided into parallelogram or trapezoid chips. Further, since the width of the above deteriorated layers formed by applying a laser beam is about 1 μm, the width of the streets 101 can be reduced. In the laser beam machine of the present invention, as only the condenser 524 of the laser beam application means 52 may be constituted to be allowed to tilt, a mechanism for tilting is simple.

We claim:

1. A laser beam processing method comprising the step of processing-feeding a wafer having devices which are formed in a large number of areas sectioned by streets arranged in a lattice pattern on a front surface while a laser beam capable of passing through the wafer is applied to the wafer, to form deteriorated layers along the streets inside of the wafer, wherein
the laser beam is applied within a second plane that is substantially perpendicular to a first plane that is parallel with a surface of the wafer and extends in the processing-feed direction of the wafer, and
the laser beam is applied so as to be at a predetermined tilt angle with respect to a third plane that is substantially perpendicular to both the second plane and the first plane extending along the processing-feed direction.

2. The laser beam processing method according to claim 1, wherein the laser beam is applied from two axisymmetric directions on either side of the third plane and along a street to form deteriorated layers having a V-shape.

3. The laser beam processing method according to claim 2, wherein V-shaped dividing portions are formed in the wafer and, thereafter, the dividing portions of the wafer are divided to form a chip of a trapezoidal shape.

4. The laser beam processing method according to claim 1, wherein the laser beam is applied from the back side surface of the wafer to have a focusing point inside the wafer near the front surface of the wafer.

5. A laser beam machine comprising:
a chuck table for holding a workpiece,
a laser beam application means including a condenser for applying a laser beam to the workpiece held on the chuck table, and
a feed means for processing-feeding the condenser and the chuck table relative to each other in a processing-feed direction in a first plane that is parallel to a surface of the workpiece wherein
the condenser tilts within a second plane that is perpendicular to the first plane and also to a third plane that is perpendicular to the first plane.

* * * * *